(12) United States Patent
Jeong et al.

(10) Patent No.: US 7,652,287 B2
(45) Date of Patent: Jan. 26, 2010

(54) THIN FILM TRANSISTOR, LIGHT-EMITTING DISPLAY DEVICE HAVING THE SAME AND ASSOCIATED METHODS

(75) Inventors: Jong-han Jeong, Suwon-si (KR);
Jae-kyeong Jeong, Suwon-si (KR);
Yeon-gon Mo, Suwon-si (KR);
Jin-seong Park, Suwon-si (KR);
Hun-jung Lee, Suwon-si (KR);
Hyun-soo Shin, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/222,497

(22) Filed: Aug. 11, 2008

(65) Prior Publication Data

US 2009/0057674 A1 Mar. 5, 2009

(30) Foreign Application Priority Data

Aug. 28, 2007 (KR) .................... 10-2007-0086510

(51) Int. Cl.
*H01L 29/04* (2006.01)
*H01L 29/10* (2006.01)
*H01L 27/12* (2006.01)

(52) U.S. Cl. .................... 257/59; 257/72; 257/350; 257/E29.117; 257/E29.151

(58) Field of Classification Search .................... 257/59, 257/72, 350, E29.117, E29.151
See application file for complete search history.

(56) References Cited

U.S. PATENT DOCUMENTS

| 6,515,310 | B2 * | 2/2003 | Yamazaki et al. | 257/98 |
| 6,838,308 | B2 | 1/2005 | Haga | |
| 7,488,986 | B2 * | 2/2009 | Yamazaki et al. | 257/93 |
| 2003/0080338 | A1 * | 5/2003 | Yamazaki et al. | 257/59 |
| 2003/0146446 | A1 * | 8/2003 | Yamazaki et al. | 257/98 |
| 2005/0001541 | A1 * | 1/2005 | Yamazaki et al. | 313/503 |
| 2008/0231179 | A1 * | 9/2008 | Abe et al. | 313/504 |

FOREIGN PATENT DOCUMENTS

| JP | 07-038370 | 2/1995 |
| JP | 2002-076356 A | 3/2002 |
| JP | 2004-183038 A | 7/2004 |
| JP | 2004-273614 A | 9/2004 |
| KR | 10-2002-0014201 A | 2/2002 |
| KR | 10-2003-0048012 A | 6/2003 |

* cited by examiner

*Primary Examiner*—Ngan Ngo
(74) *Attorney, Agent, or Firm*—Lee & Morse, P.C.

(57) ABSTRACT

A thin film transistor (TFT) includes an N-type oxide semiconductor layer on a substrate, a gate electrode spaced apart from the N-type oxide semiconductor layer by a gate dielectric layer, a source electrode contacting a first portion of the N-type oxide semiconductor layer, and a drain electrode contacting a second portion of the N-type oxide semiconductor layer. The first and second portions each have a doped region containing ions of at least one Group 1 element, and the ions of the at least one Group 1 element in the doped region may have a work function that is less than that of an N-type oxide semiconductor material included in the semiconductor layer.

19 Claims, 5 Drawing Sheets

THIN FILM TRANSISTOR, LIGHT-EMITTING DISPLAY DEVICE HAVING THE SAME AND ASSOCIATED METHODS

BACKGROUND OF THE INVENTION

1. Field of the Invention

Embodiments relate to a thin film transistor, a light emitting display device having the same and associated methods.

2. Description of the Related Art

A semiconductor layer using amorphous silicon or polysilicon has recently been developed for use in a thin film transistor (TFT) for light emitting display devices such as organic light emitting display devices, which use organic light emitting diodes (OLEDs) to emit light.

When the semiconductor layer is formed of amorphous silicon, the semiconductor layer may exhibit low mobility, and it may be difficult to use such a low mobility layer as a drive circuit of a display panel that requires a fast response time. Polysilicon may provide high mobility, but the threshold voltage of the TFT may not be uniform. Additionally, leakage current may occur in the amorphous silicon or polysilicon semiconductor layer when it is irradiated by light, e.g., light from a backlight unit.

A zinc oxide (ZnO)-based semiconductor may exhibit a band gap of 3.4 eV, which is higher than the light energy in a visible light region. Accordingly, a ZnO-based semiconductor may exhibit little or no leakage current resulting from visible light absorption. However, contact resistance (Rc) may be increased when using such a semiconductor, since a Schottky barrier may be formed due to differences in work function between the ZnO-based semiconductor and a material used to form source and drain electrodes in contact therewith. Accordingly, there is a need for a TFT in which a contact resistance between a ZnO-based semiconductor and a source/drain electrode material is reduced.

SUMMARY OF THE INVENTION

Embodiments are therefore directed to a thin film transistor, a light emitting display device having the same and associated methods, which substantially overcome one or more of the problems due to the limitations and disadvantages of the related art.

It is therefore a feature of an embodiment to provide a thin film transistor, a light emitting display device having the same and associated methods, in which a contact resistance between a semiconductor layer and an electrode is reduced.

It is therefore another feature of an embodiment to provide a thin film transistor, a light emitting display device having the same and associated methods, in which source and drain regions of a semiconductor layer include portions doped with a Group 1 element.

At least one of the above and other features and advantages may be realized by providing a TFT, including an N-type oxide semiconductor layer on a substrate, a gate electrode spaced apart from the N-type oxide semiconductor layer by a gate dielectric layer, a source electrode contacting a first portion of the N-type oxide semiconductor layer, and a drain electrode contacting a second portion of the N-type oxide semiconductor layer. The first and second portions may each have a doped region containing ions of at least one Group 1 element, and the ions of the at least one Group 1 element in the doped region may have a work function that is less than that of an N-type oxide semiconductor material included in the semiconductor layer.

A concentration of the ions of the at least one Group 1 element in the doped region may be about $10^{16}$ to about $10^{21}$ atoms/cm$^3$. The ions of the at least one Group 1 elements may be ions of hydrogen, lithium, sodium, potassium, rubidium, cesium, or francium. The N-type oxide semiconductor layer may include one or more of the following N-type oxide semiconductor materials: zinc oxide, zinc gallium oxide, zinc indium oxide, indium oxide, zinc gallium indium oxide, or zinc tin oxide.

Portions of the source and drain electrodes contacting the first and second portions may include one or more of aluminum, aluminum alloy, silver, silver alloy, molybdenum-tungsten, molybdenum, copper, indium tin oxide, or indium zinc oxide.

At least one of the above and other features and advantages may also be realized by providing a method of manufacturing a TFT, the method including forming an N-type oxide semiconductor layer on a substrate, forming a gate electrode spaced apart from the N-type oxide semiconductor layer by a gate dielectric layer, forming a source electrode that contacts a first portion of the N-type oxide semiconductor layer, and forming a drain electrode that contacts a second portion of the N-type oxide semiconductor layer. The first and second portions may each include a doped region that is doped with ions of at least one Group 1 element, and the ions of the at least one Group 1 element in the doped region may have a work function that is less than that of an N-type oxide semiconductor material included in the semiconductor layer.

The gate dielectric layer may be on the gate electrode such that the gate electrode is between the gate dielectric layer and the substrate, and the N-type oxide semiconductor layer may be on the gate dielectric layer. Forming the first and second portions may include disposing an implantation mask adjacent to the N-oxide semiconductor layer prior to forming the source and drain electrodes, the mask including openings corresponding to the first and second portions, and implanting the ions of the at least one Group 1 element into the doped regions through the openings in the mask.

The gate dielectric layer may be on the N-type oxide semiconductor layer such that the N-type oxide semiconductor layer is between the gate dielectric layer and the substrate, and the gate electrode may be on the gate dielectric layer. The method may include forming an interlayer insulator on the gate electrode and on the gate dielectric layer, forming contact holes in the interlayer insulator and the gate dielectric layer, the contact holes exposing the first and second portions of the N-type oxide semiconductor layer, doping the exposed first and second portions through the contact holes with the ions of the at least one Group 1 element, and forming the source and drain electrodes in the contact holes.

The ions of the at least one Group 1 element may be doped in the doped region to a concentration of about $10^{16}$ to about $10^{21}$ atoms/cm$^3$. The ions of the at least one Group 1 elements may be ions of hydrogen, lithium, sodium, potassium, rubidium, cesium, or francium. The N-type oxide semiconductor layer may include one or more of the following N-type oxide semiconductor materials: zinc oxide, zinc gallium oxide, zinc indium oxide, indium oxide, zinc gallium indium oxide, or zinc tin oxide. Portions of the source and drain electrodes contacting the first and second portions may be formed with one or more of aluminum, aluminum alloy, silver, silver alloy, molybdenum-tungsten, molybdenum, copper, indium tin oxide, or indium zinc oxide.

At least one of the above and other features and advantages may also be realized by providing a light emitting display device, including a substrate, a TFT on the substrate, and a light emitting diode on the substrate and electrically coupled to the TFT. The TFT may include an N-type oxide semiconductor layer on the substrate, a gate electrode spaced apart from the N-type oxide semiconductor layer by a gate dielectric layer, a source electrode contacting a first portion of the N-type oxide semiconductor layer, and a drain electrode contacting a second portion of the N-type oxide semiconductor layer, the first and second portions may have a doped region containing ions of at least one Group 1 element, and the ions of the at least one Group 1 element in the doped region may have a work function that is less than that of an N-type oxide semiconductor material included in the semiconductor layer.

A concentration of the ions of the at least one Group 1 element in the doped region may be about $10^{16}$ to about $10^{21}$ atoms/cm$^3$. The ions of the at least one Group 1 element may be ions of hydrogen, lithium, sodium, potassium, rubidium, cesium, or francium. The N-type oxide semiconductor layer may include one or more of the following N-type oxide semiconductor materials: zinc oxide, zinc gallium oxide, zinc indium oxide, indium oxide, zinc gallium indium oxide, or zinc tin oxide. Portions of the source and drain electrodes contacting the first and second portions may include one or more of aluminum, aluminum alloy, silver, silver alloy, molybdenum-tungsten, molybdenum, copper, indium tin oxide, or indium zinc oxide.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1:
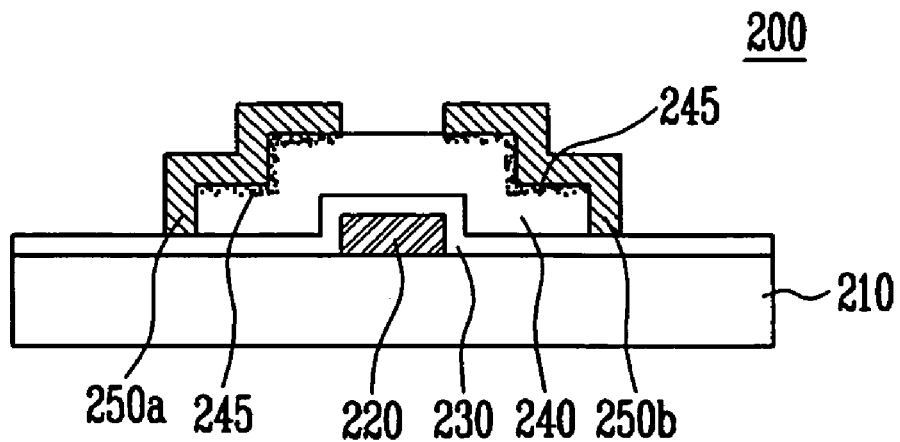
FIG. 1 illustrates a cross-sectional view of a thin film transistor according to a first example embodiment.

Korean Patent Application No. 10-2007-0086510, filed on Aug. 28, 2007, in the Korean Intellectual Property Office, and entitled: "Thin Film Transistor and Light-Emitting Display Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "a dopant" may represent a single material, e.g., lithium, or multiple materials in combination, e.g., lithium and sodium.

FIG. 1 illustrates a cross-sectional view of a thin film transistor 200 according to a first example embodiment.

Referring to FIG. 1, the thin film transistor (TFT) 200 may include a gate electrode 220 on a substrate 210, a gate insulator 230 on the substrate 210 and on the gate electrode 220, a semiconductor layer 240 on the gate insulator 230 and including a channel region, a source region and a drain region, and a source electrode 250a and a drain electrode 250b patterned on the semiconductor layer 240. The semiconductor layer 240 may be an N-type oxide semiconductor and may include one or more of, e.g., zinc oxide (ZnO), zinc gallium oxide (ZnGaO), zinc indium oxide (ZnInO), indium oxide ($In_2O_3$), zinc gallium indium oxide (ZnInGaO), or zinc tin oxide (ZnSnO).

Doped regions 245 of the semiconductor layer 240 may be aligned with points of contact between the semiconductor layer 240 and the source and drain electrodes 250a, 250b. The doped regions 245 may lower a contact resistance in the contact between the semiconductor layer 240 and the source and drain electrodes 250a, 250b.

The doped regions 245 may be doped with one or more Group 1 elements. The doped regions 245 may lower a Schottky barrier height arising from the difference in work function of the semiconductor layer 240 and the material used to form the source and drain electrodes 250a and 250b, thereby reducing contact resistance and improving the ohmic contact between the source and drain electrodes 250a and 250b and the semiconductor layer 240. The one or more Group 1 elements in the doped regions 245 may have a work function that is about 2 eV or less. A difference between the work function of the doped N-type oxide semiconductor and the work function of the source/drain electrode material may be about 2.5 eV or less. The doped region may be doped with ions of the Group 1 elements having a lower work function than the material of the semiconductor layer 240. This may improve the current-voltage characteristics of the thin film transistor 200.

The doped region 245 of the semiconductor layer 240 may be doped with ions of one or more Group 1 elements, e.g., hydrogen (H), lithium (Li), sodium (Na), potassium (K), rubidium (Rb), cesium (Cs), and/or francium (Fr). The concentration of the Group 1 element doping in the doped region 245 may be about $10^{16}$ atoms/cm$^3$ to about $10^{21}$ atoms/cm$^3$. Such a doping concentration may minimize the contact resistance in the interface between the semiconductor layer 240 and the source and drain electrodes 250a and 250b.

Providing a doping concentration in the doped region 245 of about $10^{16}$ atoms/cm$^3$ or more may help ensure that the contact resistance in the interface between the semiconductor layer 240 and the source and drain electrodes 250a and 250b is decreased. Providing a doping concentration of about $10^{21}$ atoms/cm$^3$ or less may avoid damage to the crystal lattice of the semiconductor layer 240.

The source electrode 250a and the drain electrode 250b may be formed on source and drain regions of the semiconductor layer 240, i.e., on the doped regions 245. The source electrode 250a and the drain electrode 250b may be made of metals or conductive metal oxides such as aluminum (Al), aluminum alloy, silver (Ag), silver alloy, molybdenum-tungsten (MoW), molybdenum (Mo), copper (Cu), indium tin oxide (ITO), indium zinc oxide (IZO), etc.

FIGS. 2A to 2E illustrate cross-sectional views of stages in a method of manufacturing a thin film transistor according to the first example embodiment.

Figure 2A:
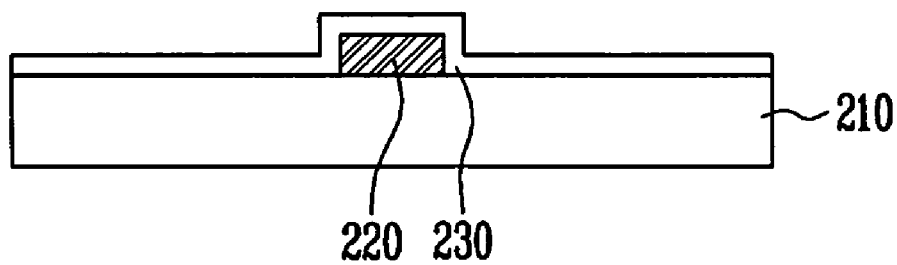
FIGS. 2A to 2E illustrate cross-sectional views of stages in a method of manufacturing a thin film transistor according to the first example embodiment.

Referring to FIG. 2A, the gate electrode 220 may be formed on the substrate 210, and the gate insulator 230 may then be formed on the surface of the substrate 210 and on the gate electrode 220.

Figure 2B:
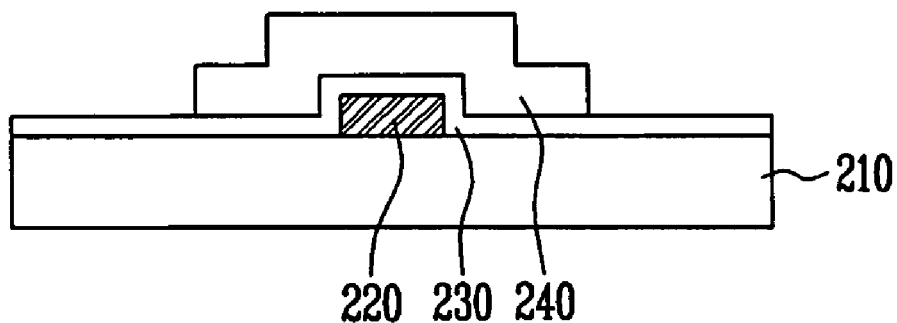

Referring to FIG. 2B, the semiconductor layer 240 for the channel region, the source region, and the drain region may be formed on the gate insulator 230. The semiconductor layer 240 may be an N-type oxide semiconductor, and may include one or more of zinc oxide (ZnO), zinc gallium oxide (ZnGaO), zinc indium oxide (ZnInO), indium oxide (In$_2$O$_3$), zinc gallium indium oxide (ZnInGaO), or zinc tin oxide (ZnSnO).

Figure 2C:
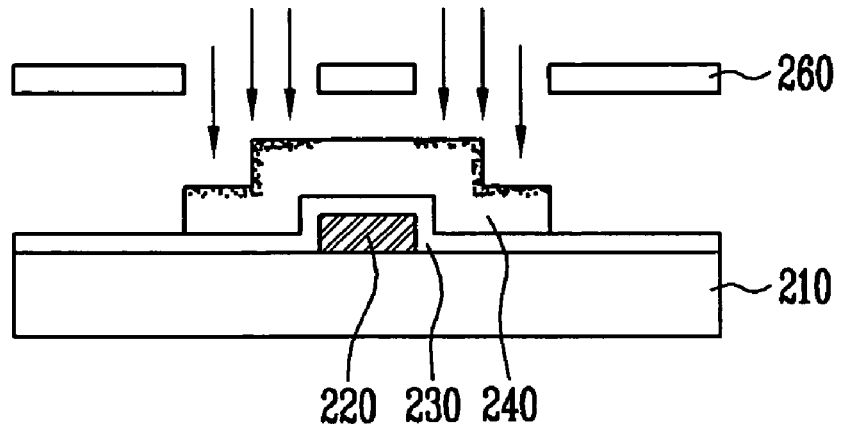

Referring to FIG. 2C, a mask 260 may be disposed adjacent to the semiconductor layer 240 to form the doped regions 245 on the semiconductor layer 240. The mask 260 may have one or more openings corresponding to regions of the semiconductor layer 240 on which source and drain electrodes 250a and 250b will be formed. Through the mask, the semiconductor layer 240 may then be implanted with ions of one or more Group 1 elements, e.g., hydrogen (H), lithium (Li), sodium (Na), potassium (K), rubidium (Rb), cesium (Cs) and francium (Fr).

Figure 2D:
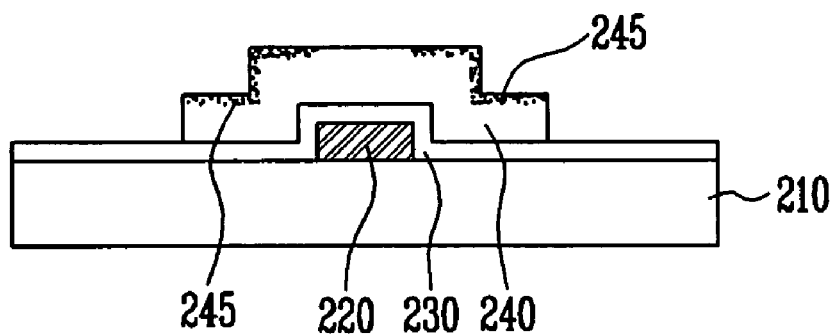

The ions may be injected into the semiconductor layer 240 by applying a high energy to the semiconductor layer 240, thereby forming the doped regions 245. The ions injected into the doped regions 245 may be distributed at a dose of about $10^{10}$ to about $10^{15}$ atoms per unit area (cm$^2$) in order to set the doped regions 245 to an ion doping concentration of about $10^{16}$ to about $10^{21}$ atoms/cm$^3$. Forming the doped regions 245 using an ion injection process may allow the amount of injected ions to be effectively controlled, and the depth of penetration of the injected ions may be controlled by controlling an accelerating energy (eV) of the injected ions. Referring to FIG. 2D, a heat treatment may be applied the doped region 245 to activate the injected ions.

Figure 2E:
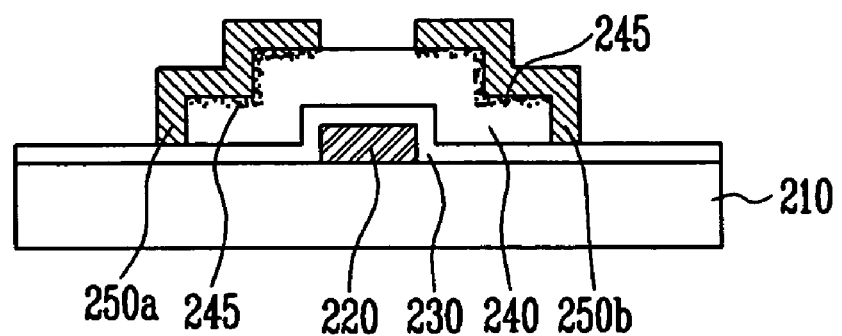

Referring to FIG. 2E, the gate dielectric layer 230 and the doped region 245 may be covered with a deposited metal or conductive metal oxide, e.g., aluminum (Al), aluminum alloy, silver (Ag), silver alloy, molybdenum-tungsten (MoW), molybdenum (Mo), copper (Cu), ITO, IZO, etc., which may then be patterned to form the source electrode 250a and the drain electrode 250b.

Figure 3:
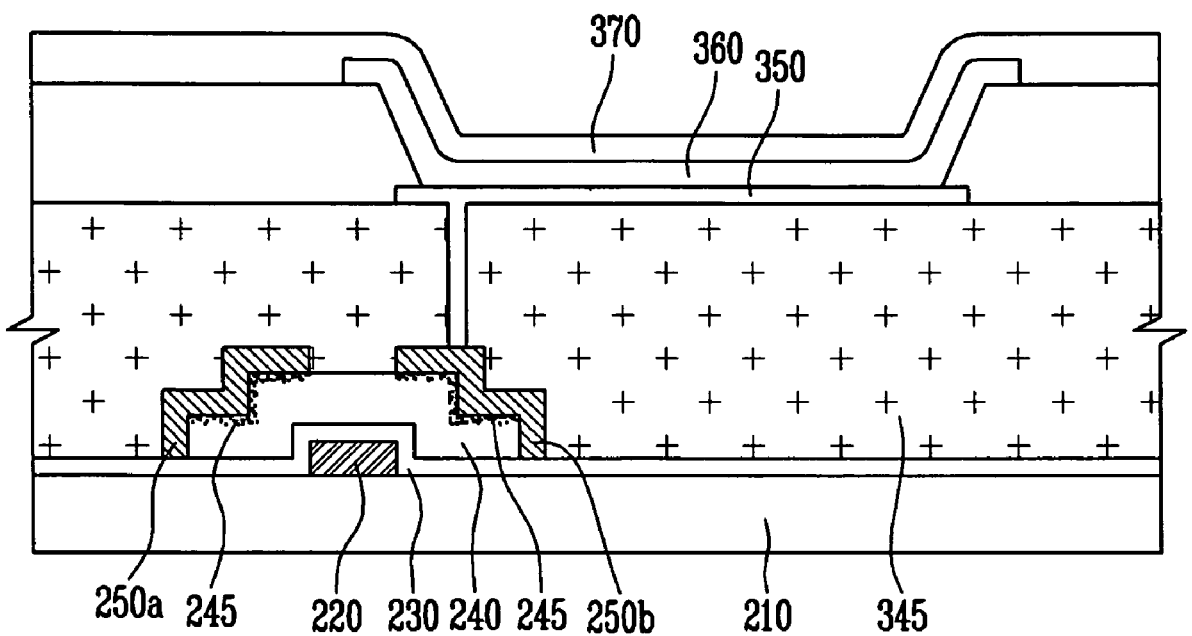
FIG. 3 illustrates a cross-sectional view of an organic light emitting display device according to the first example embodiment.

FIG. 3 illustrates a cross-sectional view of an organic light emitting display device according to the first example embodiment.

Referring to FIG. 3, the organic light emitting display device 300 may include the substrate 210, a TFT including the semiconductor layer 240 on the substrate 210 and formed of a N-type oxide semiconductor, the gate electrode 220 and source/drain electrodes 250a and 250b, and an organic light emitting diode on the TFT and electrically coupled thereto. The semiconductor layer 240 may include the doped regions 245 doped with ions of one or more Group 1 elements where the semiconductor layer 240 contacts the source/drain electrodes 250a and 250b.

The TFT on the substrate 210 may have the same configuration as the TFT 200 described above in connection with FIG. 1, and may be manufactured according to the method described above in connection with FIGS. 2A to 2E. The TFT may include the gate electrode 220 on the substrate 210, the gate insulator 230 on the substrate 210 and on the gate electrode 220, the semiconductor layer 240 on the gate insulator 230 and including the channel region, the source region and the drain region, and the source electrode 250a and drain electrode 250b on the semiconductor layer 240.

The semiconductor layer 240 contacting the source electrode 250a and the drain electrode 250b may include the doped regions 245 doped with ions of one or more Group 1 elements. The doped regions 245 may be formed to lower a Schottky barrier generated by the difference in work function of the semiconductor layer 240 and the material of the source and drain electrodes 250a, 250b in contact therewith. Forming the doped regions 245 with ions of the Group 1 elements having a lower work function than the material of the semiconductor layer 240 may decrease the Schottky barrier height. Therefore, it may be possible to reduce the contact resistance with respect to the source and drain electrodes 250a, 250b and improve current-voltage characteristics of the TFT.

In the organic light emitting display device 300, the organic light emitting diode (OLED) may be electrically coupled to the TFT. In an implementation, the OLED may be formed on the TFT, e.g., on a planarization layer 345 that covers the TFT. The OLED may include a cathode electrode 350 patterned along the pixel region, an organic matter layer 360, and an anode electrode 370.

The cathode electrode 350 may electrically contact the drain electrode 350b of the TFT through via holes. Accordingly, the semiconductor layer of the TFT may be an N-type semiconductor. The cathode electrode 350 may be formed of, e.g., indium tin oxide (ITO), Ag, or Al.

The organic layer 360 may be formed on the cathode electrode 350. The organic layer 360 may include, e.g., an electron injecting layer, an electron transport layer, a hole injecting layer, and a hole transport layer. The anode electrode 370 may be formed on the organic layer 360.

In operation of the OLED, if a predetermined voltage is applied to the anode electrode 370 and the cathode electrode 350, holes injected from the anode electrode 370 may move to the organic layer 360 via the hole transport layer, and electrons from the cathode electrode 350 may be injected into the organic layer 360 via the electron transport layer. The electrons and the holes may be re-combined in the organic layer 360 to generate excitons, and fluorescence of molecules of the organic layer 360 may result in the emission of light to form an image as the excitons shift from an excited state to a ground state.

Figure 4:
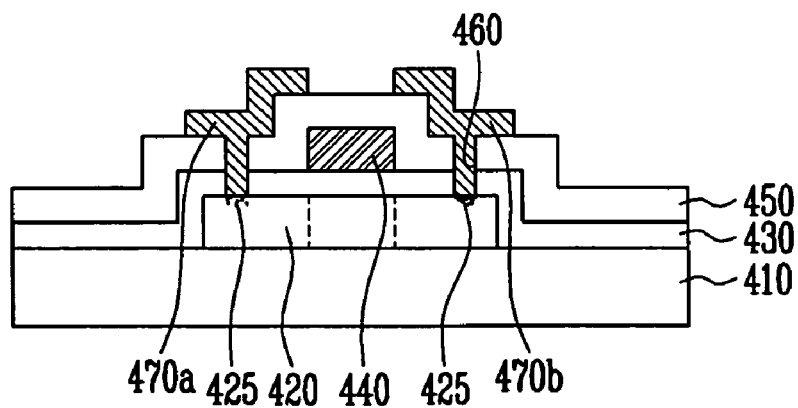
FIG. 4 illustrates a cross-sectional view of a thin film transistor according to a second example embodiment.

FIG. 4 illustrates a cross-sectional view of a thin film transistor 400 according to a second example embodiment.

Referring to FIG. 4, the TFT 400 may include a semiconductor layer 420 on the substrate 410 and including a channel region, a source region and a drain region, a gate dielectric layer 430 on the semiconductor layer 420, a gate electrode 440 on the gate dielectric layer 430 and corresponding to the channel region of the semiconductor layer 420, an interlayer dielectric layer 450 on the surface of the gate dielectric layer 430 and on the gate electrode 440, and a source electrode 470a and a drain electrode 470b on the gate dielectric layer 430 and on the interlayer dielectric layer 450. The source electrode 470a and the drain electrode 470b may be coupled to a source region and a drain region of the semiconductor layer 420 through contact holes 460. The source electrode 470a and the drain electrode 470b may be patterned on the interlayer dielectric layer 450, and may contact the respective doped regions 425. Where the semiconductor layer 420 contacts the source electrode 470a and the drain electrode 470b, it may include doped regions 425 doped with ions of one or more Group 1 elements.

The semiconductor layer 420 may be formed of an N-type oxide semiconductor and may include one or more of, e.g., zinc oxide (ZnO), zinc gallium oxide (ZnGaO), zinc indium oxide (ZnInO), indium oxide (In2O3), zinc gallium indium oxide (ZnInGaO), or zinc tin oxide (ZnSnO). The doped regions 425 doped with the ions of the Group 1 elements may be formed in the semiconductor layer 420 where it contacts the source electrode 470a and the drain electrode 470b. The doped regions 425 may improve an ohmic contact of the source and drain electrode 470a and 470b with the semiconductor layer 420 by decreasing the height of a Schottky barrier generated by the difference in work function of the semiconductor layer 420 and the material of the source and drain electrodes 470a and 470b. The ions of the Group 1 elements may have a lower work function than the materials of the semiconductor layer 420, thereby reducing contact resistance of the semiconductor layer 420 and the source and drain electrode 470a and 470b. Therefore, it may be possible to improve the current-voltage characteristics of the TFT 400.

The doped regions 425 of the semiconductor layer 420 may be doped with ions of one or more Group 1 elements, e.g., hydrogen (H), lithium (Li), sodium (Na), potassium (K), rubidium (Rb), cesium (Cs), or francium (Fr), and the concentration of the ions doped in the doped regions may be about $10^{16}$ atoms/cm$^3$ to about $10^{21}$ atoms/cm$^3$. This doping level may minimize contact resistance in an interface between the semiconductor layer 420 and the source/drain electrodes 470a and 470b.

Providing a doping concentration in the doped regions 425 of about $10^{16}$ atoms/cm$^3$ or more may help ensure that the contact resistance in the interface between the semiconductor layer 420 and the source and drain electrodes 470a and 470b is decreased. Providing a doping concentration of about $10^{21}$ atoms/cm$^3$ or less may avoid damage to the crystal lattice of the semiconductor layer 420.

FIGS. 5A to 5D illustrate cross-sectional views of stages in a method of manufacturing a thin film transistor according to the second example embodiment.

Figure 5A:
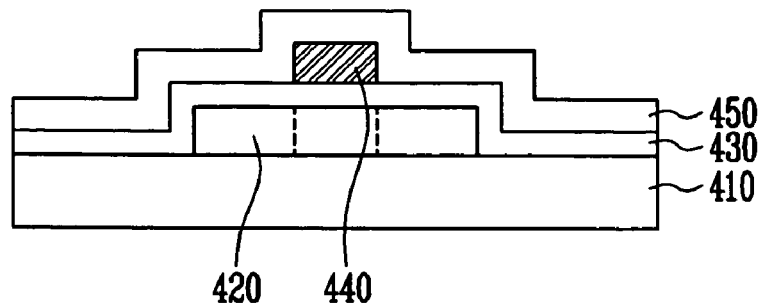
FIGS. 5A to 5D illustrate cross-sectional views of stages in a method of manufacturing a thin film transistor according to the second example embodiment.

Referring to FIG. 5A, the semiconductor layer 420 for forming the channel region, the source region and the drain region may be formed on the substrate 410. The semiconductor layer 420 may be an N-type oxide semiconductor, and may include one or more of zinc oxide (ZnO), zinc gallium oxide (ZnGaO), zinc indium oxide (ZnInO), indium oxide (In$_2$O$_3$), zinc gallium indium oxide (ZnInGaO), or zinc tin oxide (ZnSnO). The gate dielectric layer 430 may be formed on the surface of the substrate 410 and on the semiconductor layer 420. The gate electrode 440 may be formed on the gate dielectric layer 430 in a position corresponding to the channel region of the semiconductor layer 420. The interlayer dielectric layer 450 may be formed on the gate dielectric layer 430 and on the gate electrode 440. Contact holes 460 may be formed in the gate dielectric layer 430 and the interlayer dielectric layer 450 to couple the source electrode 470a to the source region of the semiconductor layer 420 and couple the drain electrode 470b to the drain region of the semiconductor layer 420.

Figure 5B:
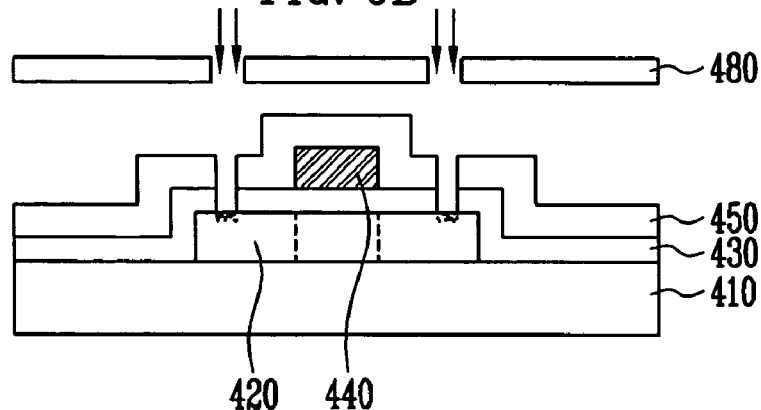
Figure 5C:
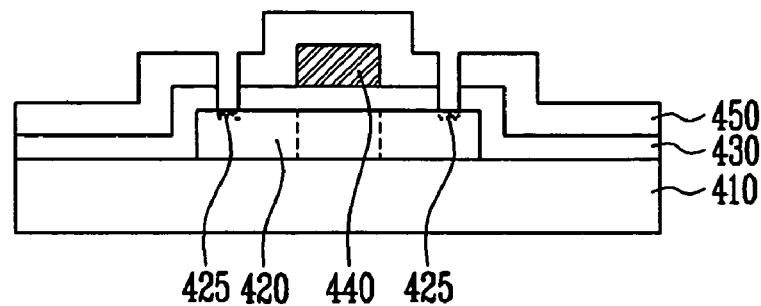

Referring to FIG. 5B, a mask 480 may be disposed adjacent to the semiconductor layer 420. The mask 480 may have one or more openings corresponding to regions of the semiconductor layer 420 on which the source and drain electrodes will be formed. The semiconductor layer 420 may be implanted with ions of one or more Group 1 elements, e.g., hydrogen (H), lithium (Li), sodium (Na), potassium (K), rubidium (Rb), cesium (Cs), or francium (Fr). The ions may be injected into the semiconductor layer 420 by applying a high energy to the semiconductor layer 420, thereby forming the doped regions 425. The ions injected into the doped regions 425 may be distributed at a dose of about $10^{10}$ to about $10^{15}$ atoms per unit area (cm$^2$) to set the doped regions 425 to an ion doping concentration of about $10^{16}$ atoms/cm$^3$ to about $10^{21}$ atoms/cm$^3$. Referring to FIG. 5C, a heat treatment may be applied to the doped regions 425 to activate the injected ions.

Figure 5D:
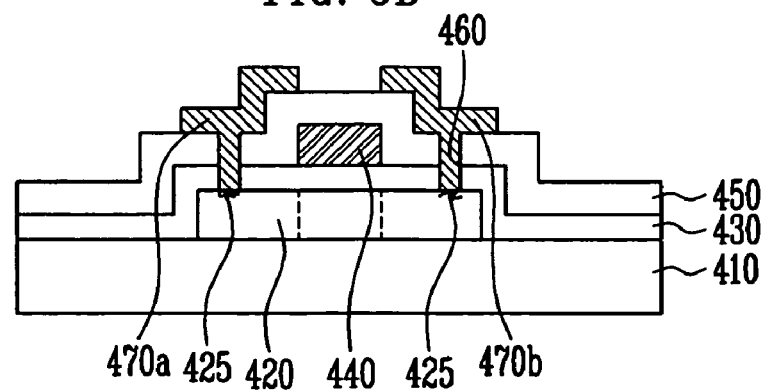

Referring to FIG. 5D, once the doped regions 425 are formed in the semiconductor layer 420, the doped regions 425 and the interlayer dielectric layer 450 may have deposited thereon a metal or conductive metal oxide, e.g., aluminum (Al), aluminum alloy, silver (Ag), silver alloy, molybdenumtungsten (MoW), molybdenum (Mo), copper (Cu), ITO, IZO, etc., which may then be patterned to form a source electrode 470a and a drain electrode 470b.

Figure 6:
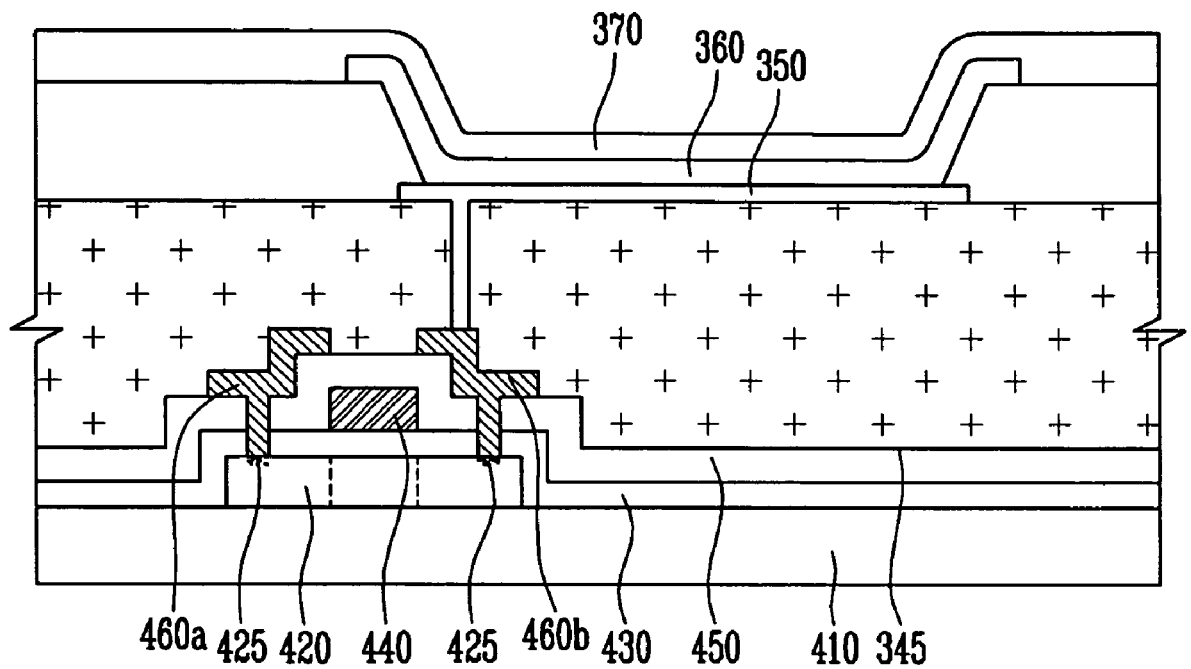
FIG. 6 illustrates a cross-sectional view of an organic light emitting display device according to the second example embodiment.

FIG. 6 illustrates a cross-sectional view of an organic light emitting display device 500 according to the second example embodiment.

Referring to FIG. 6, the organic light emitting display device 500 may include a TFT including the semiconductor layer 420 on the substrate 410 and formed of an N-type oxide semiconductor, the gate electrode 440 and source/drain electrodes 460a, 460b, and an OLED on the TFT and electrically coupled to the TFT. Where the semiconductor layer 420 contacts the source/drain electrodes 460a and 460b, it may include the doped regions 425 doped with ions of one or more Group 1 elements.

The TFT on the substrate 410 may have the same configuration as the TFT 300 described above in connection with FIG. 4, and may be manufactured according to the method described above in connection with FIGS. 5A to 5D. The TFT may include the semiconductor layer 420 on the substrate 410 and including the channel region, the source region, and the drain region, the gate dielectric layer 430 on the semiconductor layer 420, the gate electrode 440 on the gate dielectric layer 430 in a position corresponding to the channel region of the semiconductor layer 420, the interlayer dielectric layer 450 on the surface of the gate dielectric layer 430 and on the gate electrode 440, and the source electrode 460a and the drain electrode 460b coupled to the source region and the drain region of the semiconductor layer 420 through contact holes 460 formed in the gate dielectric layer 430 and the interlayer dielectric layer 450.

Where the semiconductor layer 420 contacts the source and drain electrodes 460a and 460b, it may have the doped regions 425 formed therein, the doped regions 425 being doped with the ions of one or more Group 1 elements. The doped regions 425 may decrease the height of a Schottky barrier generated by the difference in work function of the semiconductor layer 420 and the material of the source and drain electrodes 460a, 460b. The ions of the Group 1 elements in the doped regions 425 may have a lower work function than the material of the semiconductor layer 420, thereby decreasing the contact resistance of the semiconductor layer 420 and the source and drain electrodes 460a, 460b. Therefore, it may be possible to improve current-voltage characteristics of the TFT.

An OLED may be electrically coupled to the TFT and may be formed on the TFT. The OLED may be as described above in connection with the first embodiment, and may include the cathode electrode 370 patterned along the pixel region, the organic layer 380 and the anode electrode 390.

As described herein, embodiments may provide a reduced contact resistance at an interface between source and drain electrodes and an N-type oxide semiconductor layer by doping the semiconductor layer with ions of one or more Group 1 elements. Therefore, embodiments may improve current-voltage characteristics of the TFT. In addition, embodiments may provide a high-quality TFT whose ohmic contact is improved.

Example embodiments have been disclosed herein, and although specific terms are employed, they are used and are to be interpreted in a generic and descriptive sense only and not for purpose of limitation. For example, top gate (coplanar) structure and bottom gate (reverse staggered) TFT structures have been described above as example embodiments, but will be appreciated that a staggered structure TFT may also be formed with N-type oxide semiconductors in the same manner. Accordingly, it will be understood by those of ordinary skill in the art that various changes in form and details may be made without departing from the spirit and scope as set forth in the following claims.

What is claimed is:

1. A thin film transistor (TFT), comprising:
an N-type oxide semiconductor layer on a substrate;
a gate electrode spaced apart from the N-type oxide semiconductor layer by a gate dielectric layer;
a source electrode contacting a first portion of the N-type oxide semiconductor layer; and
a drain electrode contacting a second portion of the N-type oxide semiconductor layer, wherein:
the first and second portions each have a doped region containing ions of at least one Group 1 element, and
the ions of the at least one Group 1 element in the doped region have a work function that is less than that of an N-type oxide semiconductor material included in the semiconductor layer.

2. The TFT as claimed in claim 1, wherein a concentration of the ions of the at least one Group 1 element in the doped region is about $10^{16}$ to about $10^{21}$ atoms/cm$^3$.

3. The TFT as claimed in claim 1, wherein the ions of the at least one Group 1 elements are ions of one element selected from the group consisting of hydrogen, lithium, sodium, potassium, rubidium, cesium, and francium.

4. The TFT as claimed in claim 1, wherein the N-type oxide semiconductor layer includes one or more of the following N-type oxide semiconductor materials: zinc oxide, zinc gallium oxide, zinc indium oxide, indium oxide, zinc gallium indium oxide, or zinc tin oxide.

5. The TFT as claimed in claim 1, wherein portions of the source and drain electrodes contacting the first and second portions include one or more of aluminum, aluminum alloy, silver, silver alloy, molybdenum-tungsten, molybdenum, copper, indium tin oxide, or indium zinc oxide.

6. A method of manufacturing a thin film transistor (TFT), the method comprising:
forming an N-type oxide semiconductor layer on a substrate;
forming a gate electrode spaced apart from the N-type oxide semiconductor layer by a gate dielectric layer;
forming a source electrode that contacts a first portion of the N-type oxide semiconductor layer; and
forming a drain electrode that contacts a second portion of the N-type oxide semiconductor layer, wherein:
the first and second portions each include a doped region that is doped with ions of at least one Group 1 element, and
the ions of the at least one Group 1 element in the doped region have a work function that is less than that of an N-type oxide semiconductor material included in the semiconductor layer.

7. The method as claimed in claim 6, wherein:
the gate dielectric layer is on the gate electrode such that the gate electrode is between the gate dielectric layer and the substrate, and
the N-type oxide semiconductor layer is on the gate dielectric layer.

8. The method as claimed in claim 7, wherein forming the first and second portions includes:
disposing an implantation mask adjacent to the N-oxide semiconductor layer prior to forming the source and drain electrodes, the mask including openings corresponding to the first and second portions, and
implanting the ions of the at least one Group 1 element into the doped regions through the openings in the mask.

9. The method as claimed in claim 6, wherein:
the gate dielectric layer is on the N-type oxide semiconductor layer such that the N-type oxide semiconductor layer is between the gate dielectric layer and the substrate, and
the gate electrode is on the gate dielectric layer.

10. The method as claimed in claim 9, wherein the method comprises:
forming an interlayer insulator on the gate electrode and on the gate dielectric layer;
forming contact holes in the interlayer insulator and the gate dielectric layer, the contact holes exposing the first and second portions of the N-type oxide semiconductor layer;
doping the exposed first and second portions through the contact holes with the ions of the at least one Group 1 element; and
forming the source and drain electrodes in the contact holes.

11. The method as claimed in claim 6, wherein the ions of the at least one Group 1 element are doped in the doped region to a concentration of about $10^{16}$ to about $10^{21}$ atoms/cm$^3$.

12. The method as claimed in claim 6, wherein the ions of the at least one Group 1 elements are ions of one element selected from the group consisting of hydrogen, lithium, sodium, potassium, rubidium, cesium, and francium.

13. The method as claimed in claim 6, wherein the N-type oxide semiconductor layer includes one or more of the following N-type oxide semiconductor materials: zinc oxide, zinc gallium oxide, zinc indium oxide, indium oxide, zinc gallium indium oxide, or zinc tin oxide.

14. The method as claimed in claim 6, wherein portions of the source and drain electrodes contacting the first and second portions are formed with one or more of aluminum, aluminum alloy, silver, silver alloy, molybdenum-tungsten, molybdenum, copper, indium tin oxide, or indium zinc oxide.

15. A light emitting display device, comprising:

a substrate;

a TFT on the substrate; and a light emitting diode on the substrate and electrically coupled to the TFT, wherein:

the TFT includes an N-type oxide semiconductor layer on the substrate, a gate electrode spaced apart from the N-type oxide semiconductor layer by a gate dielectric layer, a source electrode contacting a first portion of the N-type oxide semiconductor layer, and a drain electrode contacting a second portion of the N-type oxide semiconductor layer, the first and second portions have a doped region containing ions of at least one Group 1 element, and the ions of the at least one Group 1 element in the doped region have a work function that is less than that of an N-type oxide semiconductor material included in the semiconductor layer.

16. The light emitting display device as claimed in claim 15, wherein a concentration of the ions of the at least one Group 1 element in the doped region is about $10^{16}$ to about $10^{21}$ atoms/cm$^3$.

17. The light emitting display device as claimed in claim 15, wherein the ions of the at least one Group 1 element are ions of one element selected from the group consisting of hydrogen, lithium, sodium, potassium, rubidium, cesium, and francium.

18. The light emitting display device as claimed in claim 15, wherein the N-type oxide semiconductor layer includes one or more of the following N-type oxide semiconductor materials: zinc oxide, zinc gallium oxide, zinc indium oxide, indium oxide, zinc gallium indium oxide, or zinc tin oxide.

19. The light emitting display device as claimed in claim 15, wherein portions of the source and drain electrodes contacting the first and second portions include one or more of aluminum, aluminum alloy, silver, silver alloy, molybdenum-tungsten, molybdenum, copper, indium tin oxide, or indium zinc oxide.

* * * * *